United States Patent
Ichiyama et al.

(10) Patent No.: US 7,564,897 B2
(45) Date of Patent: Jul. 21, 2009

(54) JITTER MEASURING APPARATUS, JITTER MEASURING METHOD AND PLL CIRCUIT

(75) Inventors: Kiyotaka Ichiyama, Tokyo (JP); Masahiro Ishida, Tokyo (JP); Takahiro Yamaguchi, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 633 days.

(21) Appl. No.: 10/896,751

(22) Filed: Jul. 22, 2004

(65) Prior Publication Data

US 2006/0018418 A1    Jan. 26, 2006

(51) Int. Cl.
*H04B 3/46* (2006.01)
(52) U.S. Cl. .................... 375/226; 375/224; 375/376
(58) Field of Classification Search .............. 375/226, 375/276, 376
See application file for complete search history.

(56) References Cited

U.S. PATENT DOCUMENTS

| | | | | |
|---|---|---|---|---|
| 4,929,917 A | * | 5/1990 | Yokogawa et al. | 331/1 A |
| 5,257,415 A | * | 10/1993 | Kumagai et al. | 455/126 |
| 5,563,921 A | * | 10/1996 | Mesuda et al. | 375/376 |
| 5,757,652 A | * | 5/1998 | Blazo et al. | 702/69 |
| 5,793,822 A | * | 8/1998 | Anderson et al. | 375/371 |
| 6,100,724 A | * | 8/2000 | Yoshimura et al. | 327/100 |
| 6,396,889 B1 | * | 5/2002 | Sunter et al. | 375/376 |
| 6,687,629 B1 | * | 2/2004 | Yamaguchi et al. | 702/69 |
| 6,836,872 B2 | * | 12/2004 | Abdennadher | 716/4 |
| 7,020,793 B1 | * | 3/2006 | Hsieh | 713/401 |
| 7,142,622 B1 | * | 11/2006 | Brunn et al. | 375/375 |
| 2003/0098731 A1 | * | 5/2003 | Tabatabaei et al. | 327/160 |
| 2003/0112915 A1 | * | 6/2003 | Meltzer | 375/376 |
| 2003/0133522 A1 | * | 7/2003 | Staszewski et al. | 375/345 |
| 2003/0227989 A1 | * | 12/2003 | Rhee et al. | 375/376 |
| 2003/0231730 A1 | * | 12/2003 | Wong et al. | 375/376 |
| 2004/0101076 A1 | * | 5/2004 | MacIsaac et al. | 375/354 |
| 2004/0252802 A1 | * | 12/2004 | Yamaguchi | 375/371 |
| 2005/0024155 A1 | * | 2/2005 | Huang | 331/25 |

* cited by examiner

*Primary Examiner*—David C Payne
*Assistant Examiner*—Leon-Viet Q Nguyen
(74) *Attorney, Agent, or Firm*—Osha • Liang LLP (57) ABSTRACT

A jitter measurement apparatus for measuring an intrinsic jitter of a circuit to be tested including a phase detector which outputs a signal according to a phase difference between a supplied first input signal and a supplied second input signal, includes: an input unit for supplying an identical signal to the phase detector as the first input signal and as the second input signal; and a jitter measurement unit for measuring the intrinsic jitter of the circuit to be tested by measuring a jitter of a signal which is generated in an inside of the circuit to be tested according to an signal output from the phase detector.

15 Claims, 5 Drawing Sheets

JITTER MEASURING APPARATUS, JITTER MEASURING METHOD AND PLL CIRCUIT

BACKGROUND OF THE INVENTION

1. Field of the Invention

The present invention relates to a jitter measurement apparatus and a jitter measurement method for measuring an intrinsic jitter of a circuit to be tested, including a phase detector which outputs a signal according to a phase difference between a supplied first input signal and a supplied second input signal, and a phase locked loop circuit which outputs an oscillation signal synchronized with a reference clock that is supplied.

2. Description of Related Art

As a method for measuring the intrinsic jitter which is generated in an inside of a circuit, such as a Phase Locked Loop circuit, a method for detecting a jitter of the signal output from the PLL circuit by inputting a reference clock, of which jitter is enough small, to the PLL circuit is well known. According to the technology, the jitter generated in the output signal is measured as the intrinsic jitter by considering that a jitter of the reference clock has no jitter.

However, according to the conventional jitter measurement method, it is very difficult that the reference clock has completely no jitter, so that the jitter of the reference clock has inevitably an influence on the jitter generated in the PLL circuit, and consequently, it is impossible to measure the intrinsic jitter of only the PLL circuit with high accuracy. Alternatively, it is very expensive to reduce the jitter of the reference clock to be negligibly small.

Moreover, since the intrinsic jitter is calculated by measuring the output signal of the PLL circuit in the conventional method, it is impossible to specify how much the jitter is generated and which components of the PLL circuit generates the jitter.

Accordingly, it is an object of the present invention to provide a jitter measurement apparatus, a jitter measurement method, and a PLL circuit, which are capable of overcoming the above drawbacks accompanying the conventional art. The above and other objects can be achieved by combinations described in the independent claims. The dependent claims further advantageous and exemplary combinations of the present invention.

SUMMARY OF THE INVENTION

In order to achieve these desired objectives, according to the first aspect of the present invention, a jitter measurement apparatus for measuring an intrinsic jitter of a circuit to be tested including a phase detector which outputs a signal according to a phase difference between a supplied first input signal and a supplied second input signal, includes: an input unit for supplying an identical signal to the phase detector as the first input signal and as the second input signal; and a jitter measurement unit for measuring the intrinsic jitter of the circuit to be tested by measuring a jitter of a signal which is generated in an inside of the circuit to be tested according to an signal output from the phase detector.

The jitter measurement unit may measure the intrinsic jitter of the phase detector by measuring a jitter of a signal output from the phase detector. The circuit to be tested may further include a latter circuit which receives a signal output from the phase detector and outputs a signal based on a received signal, and the jitter measurement apparatus may measure a jitter of a signal output from the latter circuit. The jitter measurement unit may measure an intrinsic jitter of the latter circuit based on a difference between a jitter of a signal output from the phase detector and a jitter of a signal output from the latter circuit.

The circuit to be tested corresponding to a phase locked loop circuit may further include a charge pump for outputting a signal according to a signal output from the phase detector, a loop filter for outputting a signal according to a signal output from the charge pump, a voltage controlled oscillator for outputting an oscillation signal according to a signal output from the loop filter, and a frequency divider for dividing the oscillation signal output from the voltage controlled oscillator and outputting a divided signal to the phase detector, and the jitter measurement unit may measure at least one of the signal output from the charge pump, the loop filter, the voltage controlled oscillator and the frequency divider.

The input unit may further include a signal selector which receives the second input signal and a signal output from the frequency divider, and the signal selector may select the second input signal and input the selected second input signal to the phase detector when measuring a intrinsic jitter of the circuit to be tested, and the signal selector may select a signal output from the frequency divider and input the selected signal outputted from the frequency divider to the phase detector when the circuit to be tested operates as a PLL circuit. The input unit may further include a dummy selector which receives the first input signal and inputs the received first input signal to the phase detector, the dummy selector having the same characteristic of the signal selector.

The input unit may input signals, between which phase difference is approximately zero and of which wave shapes are identical, to the phase detector as the first input signal and as the second input signal. The input unit may input signals, between which phase difference is not zero and of which wave shapes are identical, to the phase detector as the first input signal and as the second input signal.

The input section may input a clock signal, of which period is constant, to the phase detector as the first input signal and as the second input signal. The input section may input a data signal of which period is not constant, to the phase detector as the first input signal and as the second input signal.

The input section may change a frequency of each of the first input signal and the second input signal sequentially and may input the changed signals to the phase detector, and the jitter measurement unit may measure the intrinsic jitter of the circuit to be tested every time the input unit changes the frequency.

According to the second aspect of the present invention, a phase locked loop circuit including an oscillation mode for inputting a oscillation signal synchronized with a reference clock that is supplied, and a measuring mode for measuring an intrinsic jitter, includes a voltage controlled oscillator for generating the oscillation signal having a frequency based on a control voltage, a frequency divider for dividing the oscillation signal, a phase detector for generating the control voltage based on a phase difference between the reference clock and a comparable signal that is supplied, and a signal selector which receives the reference clock and a signal output from the frequency divider. The signal selector supplies the reference clock to the phase detector as the comparable signal when the phase locked loop circuit operates in the measurement mode, and the signal selector supplies a signal output from the frequency divider to the phase detector as the comparable signal when the phase locked loop circuit operates in the oscillation mode.

The phase locked loop circuit may further include an output terminal from which the control voltage of the phase detector is output to an external measurement apparatus.

According to the third aspect of the present invention, a method for a jitter measurement method for measuring an intrinsic jitter of a circuit to be tested including a phase detector which outputs a signal based on a phase difference between a supplied first input signal and a supplied second input signal, includes steps of supplying an identical signal to the phase detector as the first input signal and as the second input signal and measuring the intrinsic jitter of the circuit to be tested by measuring a jitter of a signal which is generated in an inside of the circuit to be tested, according to an output signal output from the phase detector.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
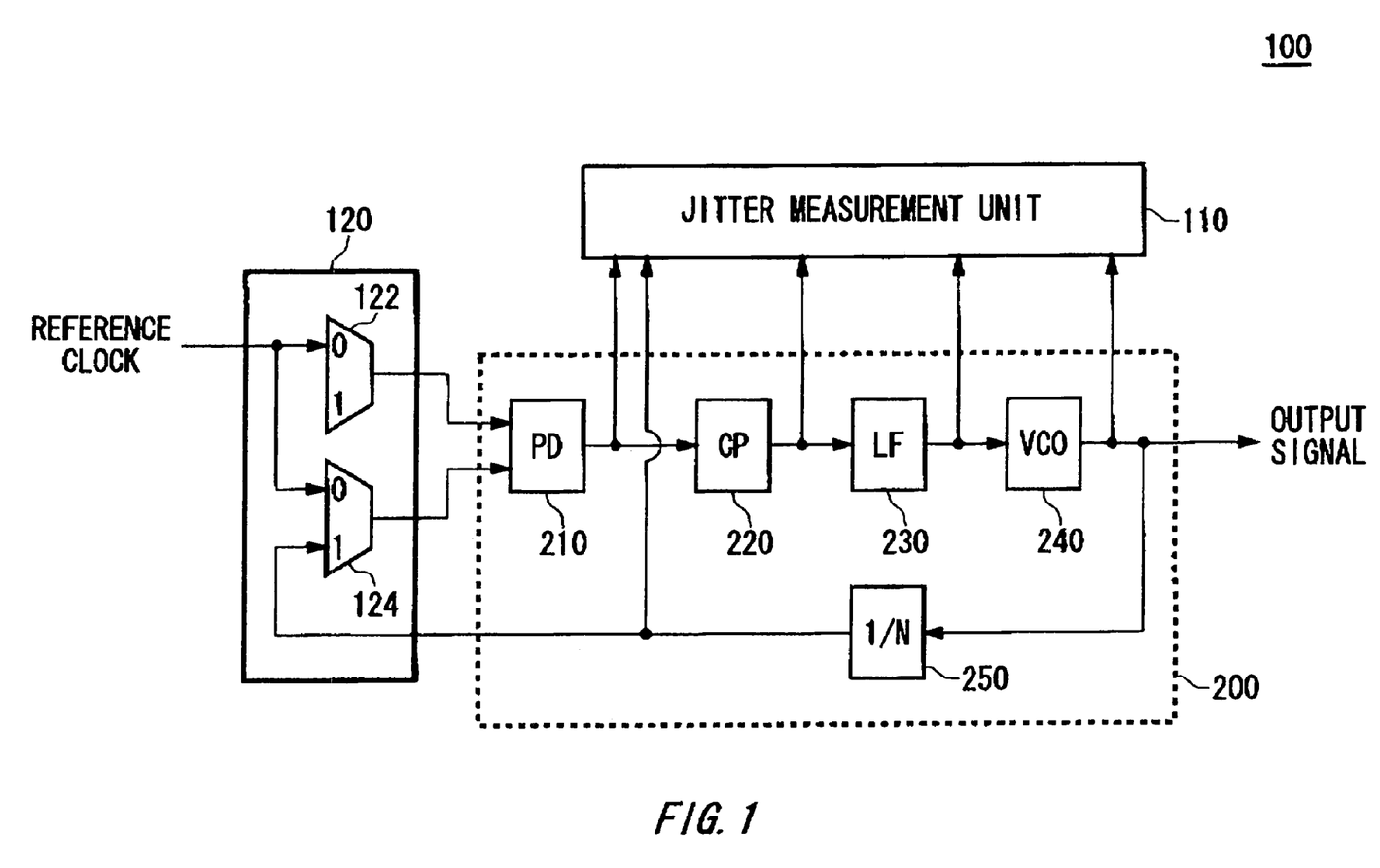
FIG. 1 shows a configuration of a jitter measurement apparatus 100 according to an embodiment of the present invention.

FIG. 1 shows a configuration of a jitter measurement apparatus 100 according to an embodiment of the present invention. The jitter measurement apparatus 100 measures an intrinsic jitter of a circuit to be tested including a phase detector. In this example, the jitter measurement apparatus 100 includes a jitter measurement unit 110 and an input unit 120 to measure an intrinsic jitter of a PLL circuit 200. At first, the overview of the PLL circuit 200 which corresponds to the circuit to be tested will be explained.

The PLL circuit 200 includes a phase detector 210, a charge pump 220, a loop filter 230, a voltage controlled oscillator 240 and a frequency divider 250. The PLL circuit 200 has both an oscillation mode and a measurement mode. The oscillation mode is a mode for outputting an oscillation signal synchronized with a reference clock that is supplied. The measurement mode is a mode for measuring an intrinsic jitter.

The phase detector 210 outputs a signal according to a phase difference between a supplied first input signal and a supplied second input signal. In this example, the phase detector 210 receives a reference clock as the first input signal and the PLL circuit 200 generates an oscillation signal that is synchronized with the reference clock. The mean voltage $V_{PD}(s)$ [V] output from the phase detector 210 per a period, is given by the following Equation (1)

$$V_{PD}(s)=K_{PD} \cdot \Theta_{diff}(s)[V] \quad (1)$$

where $K_{PD}$ [V/rad] represents the gain of the phase detector 210 and $\Theta_{diff}(s)$ [rad] represents the phase difference between the first input signal and the second input signal. In this case, s represents the Laplace transform operator (complex variables).

The charge pump 220 outputs a signal according to the signal output from the phase detector 210. In other words, the charge pump 220 converts the voltage $V_{PD}(s)$ [V] output from the phase detector 210 to the mean current $I_{CP}(s)$ [A]. The mean current $I_{CP}(s)$ [A] output from the charge pump 220 is given by the following Equation (2)

$$I_{CP}=K_{CP} \cdot V_{PD}(s)[A] \quad (2)$$

where $K_{CP}$ [A/V] represents the convert ratio from the voltage to current of the charge pump 220.

The loop filter 230 allows a predetermined low frequency component of a signal output from the charge pump 220 to pass, and generates a control voltage for controlling a frequency of the oscillation signal which is generated by the voltage controlled oscillator 240. The control voltage $V_{LF}(S)$ is given by the following Equation (3)

$$V_{LF}(s)=G(s) \cdot I_{CP}(s)[V] \quad (3)$$

where G(s) [V/A] represents the convert ratio from the current to voltage of the loop filter 230.

The voltage controlled oscillator 240 outputs the oscillation signal having a frequency according to the signal output from the loop filter 230. The frequency $f_{VCO}(S)$ of the oscillation signal output from the voltage controlled oscillator 240 is proportional to the input voltage $V_{LF}(s)$. In other words, the frequency $f_{VCO}(S)$ becomes;

$$f_{VCO}(s)=K_{VCO} \cdot V_{LF}(s)[Hz] \quad (4)$$

where $K_{VCO}$[Hz/V] represents the proportional constant of the frequency of the oscillation signal to the input voltage $V_{LF}(S)$. Since the phase of the oscillation signal is proportional to the time integration of the frequency, the phase $\Phi_{OUT}(s)$ [rad] is proportional to the time integration of the input voltage $V_{LF}(S)$. Therefore, the output response of the voltage controlled oscillator 240 is represented by the Equation (5).

$$\Phi_{OUT}(s) = \frac{2\pi K_{VCO}}{s} V_{LF}(s) \quad (5)$$

The frequency divider 250 divides the oscillation signal by a predetermined division ration and feeds back the divided signal to the phase detector 210 as the second input signal, so that the reference clock and the oscillation signal are synchronized. The phase $\Phi'_{OUT}(s)$ is given by Equation (6)

$$\Phi'_{OUT}(s) = \frac{\Phi_{OUT}(s)}{N}[rad] \quad (6)$$

where N represents the division ration of the frequency divider 250. In other words, the phase difference $\Theta_{diff}(s)$ of the phase detector 210 is given by following Equation (7)

$$\Theta_{diff}(s) = \Theta(s) - \frac{\Phi_{OUT}(s)}{N}[rad] \quad (7)$$

where $\Theta(s)$ represents the phase of the reference clock.

Next, how the jitter measurement apparatus 100 operates will be explained. When the PLL circuit 200 is operated in the measurement mode, the input unit 120 supplies identical reference clocks to the phase detector 210 as the first input signal and as the second input signal. Alternatively, when the PLL circuit 200 is operated in the oscillation mode, the input unit 120 supplies the reference clock to the phase detector 210 as the first input signal and supplies the signal output from the frequency divider 250 to the phase detector 210 as the second input signal. Here, each of the identical signals has substantially the same wave shape. For example, the identical signal may be branched from the reference clock generated from a signal source. In this case, it is preferable that each of the branched paths has no element that applies jitters to the reference clock. Moreover, if there is an element that applies a jitter to the reference clock in either path, it is preferable to provide an element in other paths, in order to apply the identical jitters to the reference clock.

The input unit 120 includes a multiplexer 124 which acts as the signal selector and a multiplexer 122 which acts as the dummy selector. The multiplexer 124 receives both the branched reference clock and the signal output from the frequency divider 250, and selects a signal corresponding to the operating mode of the PLL circuit 200 and inputs the selected signal to the phase detector 210 as the second input signal. In other words, when the PLL circuit 200 operates in the oscillation mode, the multiplexer 124 inputs the signal output from the frequency divider 250 to the phase detector 210 as the second input signal, whereas when the PLL circuit 200 operates in the measurement mode, the multiplexer 124 inputs the branched reference clock to the phase detector 210 as the second input signal. Moreover, the jitter measurement unit 110 may supply a signal in order to control the multiplexer 124 according to the operating mode of the PLL circuit 200.

The multiplexer 122 includes the same characteristic as the multiplexer 124 and when receiving the reference clock, the multiplexer 122 inputs the received reference clock to the phase detector 210 as the first input signal. According to the configuration described above, the reference clock input to the phase detector 210 via the multiplexer 122 and the reference clock input to the phase detector 210 via the multiplexer 124 are identical. Thus, the intrinsic jitter caused by only the phase detector 210 is applied to the signal output from the phase detector 210.

The jitter measurement unit 110 measures the intrinsic jitter of the circuit to be tested by measuring a jitter of the signal which is generated in the inside of the PLL circuit 200 according to the signal output from the phase detector 210. Since the signal output from the phase detector 210 has no jitter caused by the jitter of the input signal, the intrinsic jitter of the PLL circuit 200 can be measured accurately according to the jitter measurement apparatus 100 in this example.

For example, The jitter measurement unit 110 may measure the intrinsic jitter of the phase detector 210 by measuring the jitter of the signal output from the phase detector 210. Alternatively, the jitter measurement unit 110 may measure the jitter of the output signal of the latter circuit of the phase detector 210. The latter circuit is defined as the circuit which receives a signal output from the phase detector 210 and further outputs a signal based on the received signal. In this example, each of the charge pump 220, the loop filter 230, the voltage controlled oscillator 240 and the frequency divider 250 is an example of the latter circuit of the phase detector 210, and the jitter measurement unit 110 may measure at least one of the jitters of the charge pump 220, the loop filter 230, the voltage controlled oscillator 240 and the frequency divider 250. In this case, the jitter measurement unit 110 can measure the intrinsic jitter of the circuits corresponding from the phase detector 210 to any component which output the measured signal.

Alternatively, the jitter measurement unit 110 may measure the intrinsic jitter of the latter circuit, based on the difference between a jitter of the signal output from the phase detector 210 and the jitter of the signal output from the latter circuit. In other words, the jitter measurement apparatus 100 may measure the intrinsic jitter of the latter circuit by subtracting the jitter of the output signal of the phase detector 210 multiplied by a gain of the latter circuit from the jitter of the output signal of the phase detector 210. For example, the intrinsic jitter $\sigma_{CP}$ of the charge pump 220 is given by the following Equation (8)

$$\sigma_{CP} = \sqrt{\sigma^2 PD + CP - (K_{CP} \cdot \sigma_{PD})^2} \qquad (8)$$

where $\sigma_{CP}$ represents the jitter of the signal output from the phase detector 210 and $\sigma_{PD+CP}$ represents the jitter of the signal output from the charge pump 220.

Similarly, the intrinsic jitters of each of the loop filter 230, the voltage controlled oscillator 240 and the frequency divider 250 can be easily measured based on the jitters output from the component and on the jitters output from the preceding component.

As explained above, the jitter measurement unit 110 measures at least one of the jitter of the signals output from the phase detector 210, the charge pump 220, the loop filter 230, the voltage controlled oscillator 240 and the frequency divider 250, so that the jitter measurement unit 110 can measure the intrinsic jitter of the circuit corresponding from the phase detector 210 to the measured component. In addition, the jitter measurement unit 110 measures at least one of the jitter of the signal output from the phase detector 210, the charge pump 220, the loop filter 230, the voltage controlled oscillator 240 and the frequency divider 250, and compares the measured jitter with the jitter of the signal output from the preceding component, so that the jitter measurement unit 10 can measure the intrinsic jitter of this component.

In this example, the input unit 120 inputs the signals, between which phase difference is approximately zero and of which wave shape are identical, to the phase detector 210 as the first input signal and as the second input signal. However, in another example, the input unit 120 may input the signals, between which phase difference is not zero and of which wave shape are identical, to the phase detector 210 as the first input signal and as the second input signal. Even if the signal input to the phase detector 210 has a phase difference, the signal output from the phase detector 210 has no jitter caused by the phase difference of the input signal when the phase difference is constant. Therefore, the intrinsic jitter of the circuit to be tested can be measured accurately.

Moreover, the jitter measurement unit 110 may measure the jitter of the signal by using a spectrum analyzer, an oscilloscope or other measuring devices. In addition, the jitter measurement unit 110 preferably includes a current probe to measure the output signal of the charge pump 220.

In addition, the input unit 120 may input identical clock signals having a constant period, to the phase detector 210 as the first input signal and as the second input signal. Alternatively, the input unit 120 may input identical data signals not having a constant period, to the phase detector 210 as the first input signal and as the second input signal.

In addition, the input unit 120 may change a frequency of the reference clock sequentially when inputting the reference clock to the phase detector 210 as the first input signal and as the second input signal. In this case, the jitter measurement unit 110 measures the intrinsic jitters of the circuit to be tested every time the input unit 120 changes the frequencies.

Figure 2:
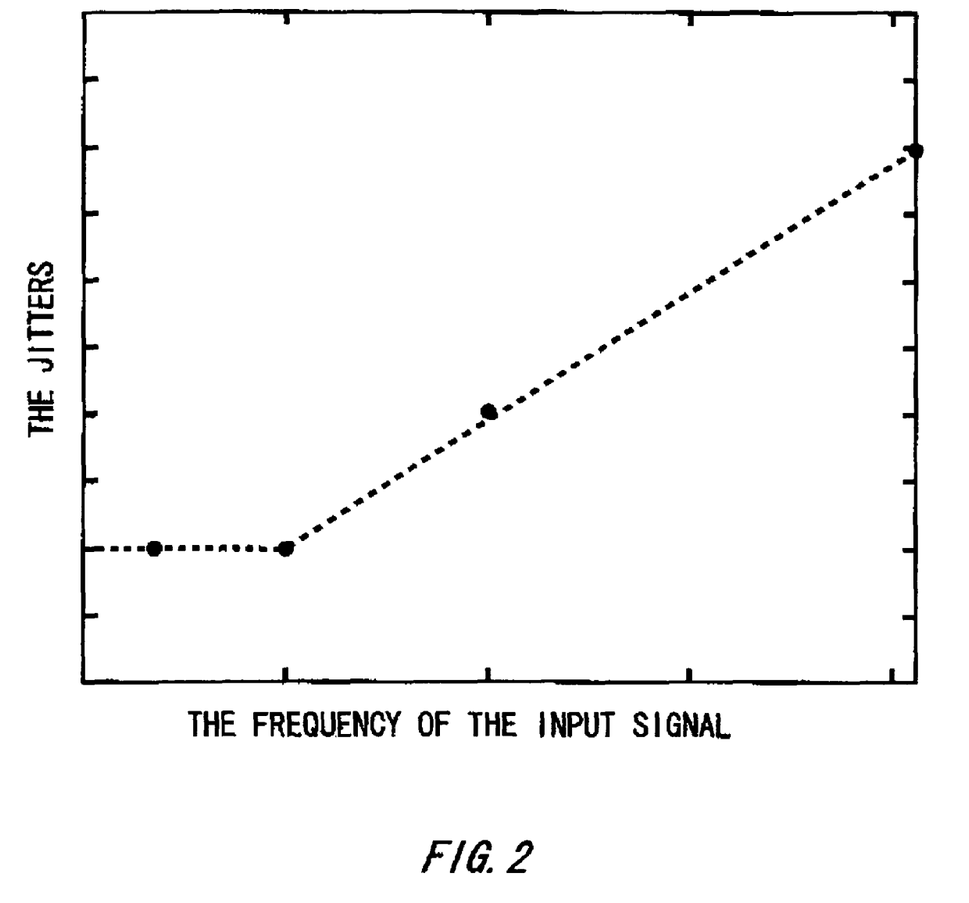
FIG. 2 shows an example of measurement results of intrinsic jitters of a circuit to be tested, measured in every frequency of input signals which are input to the phase detector 210.

FIG. 2 shows an example of measurement results of intrinsic jitters of the circuit to be tested, measured in every frequencies of the input signals input to the phase detector 210. As shown in FIG. 2, according to the jitter measurement apparatus 100 in this example, the intrinsic jitters according to the frequency of the input signal can be measured accurately.

Figure 3:
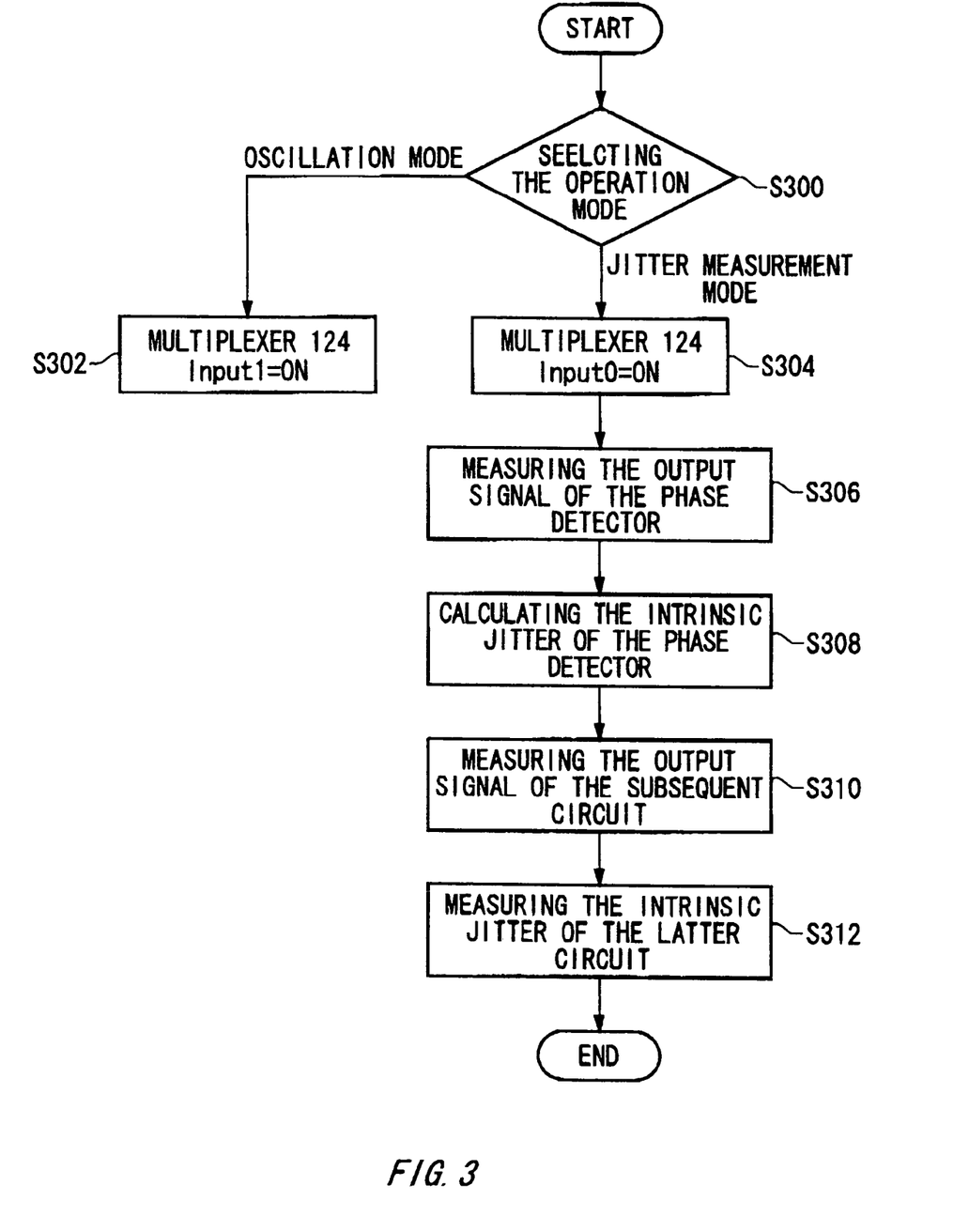
FIG. 3 shows an example of a flowchart of a jitter measurement method using the jitter measurement apparatus 100.

FIG. 3 is a flowchart exemplary illustrating a jitter measurement method using the jitter measurement apparatus 100. At first, the operating mode of the PLL circuit 200 is selected (S300). When The PLL circuit 200 is operated in the oscillation mode, a signal output from the frequency divider 250 is selected by the multiplexer 124 and the selected signal is input to The phase detector 210 (S302).

When the PLL circuit 200 is operated in the measurement mode, a reference clock is selected by the multiplexer 124 and the selected signal is input to the phase detector 210. In other words, in the input step, i.e. in S304, an identical reference clock is input to the phase detector 210 as the first input signal and as the second input signal.

Next, as explained with reference to FIG. 1, the input signal of the phase detector 210 is measured by using the jitter measurement unit 110 (S306), and the intrinsic jitter of the phase detector 210 is calculated (S308).

Next, as explained with reference to FIG. 1, the input signal of the latter circuit of the phase detector 210 is measured by using the jitter measurement unit 110 (S310), and the intrinsic jitter of the latter circuit is calculated (S312). The step of S310 and the step of S312 may be executed repeatedly with respect to each component that is to be measured in the latter circuit.

Figure 4:
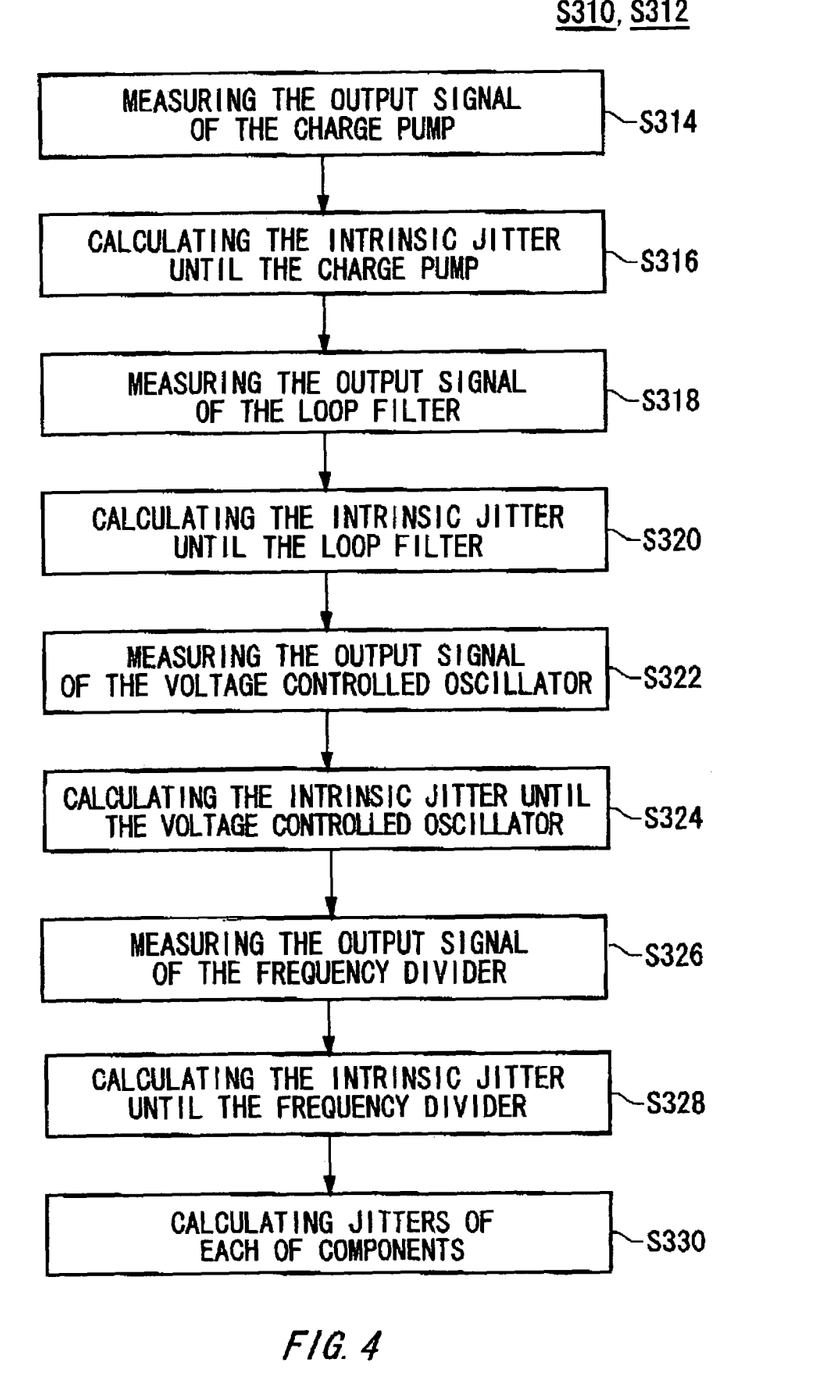
FIG. 4 shows an example of the flowchart illustrating a method for measuring the jitters of each of the components of a latter circuit in the PLL circuit 200.

FIG. 4 shows an example of the flowchart illustrating a method for measuring jitters of each of the components of the latter circuit in the PLL circuit 200. In a method according to this example, the steps from S300 to S312 are identical to the corresponding steps explained in FIG. 3 respectively, and therefore the description thereof is omitted.

At first, the output signal of the charge pump 220 is measured (S314), and the intrinsic jitter corresponding from the phase detector 210 to charge pump 220 is calculated. Next, the output signal of the loop filter 230 is measured (S318) and the intrinsic jitter corresponding from the phase detector 210 to the loop filter 230 is calculated (S320). Similarly, the output signal of the voltage controlled oscillator 240 and the output signal of the frequency divider 250 are measured and the intrinsic jitter corresponding from the phase detector 210 to the voltage controlled oscillator 240 and the intrinsic jitter corresponding from the phase detector 210 the frequency divider 250 are calculated.

Then, the jitter of each of the component is calculated (S330). As explained with reference to FIG. 1 using Equation (8), at the step S330, the intrinsic jitter of each of the component is calculated based on the jitter of signal output from both the component and the jitter of signal output from the preceding component.

According to the procedure as described above, it can be measured accurately that which components generate intrinsic jitters and how much the intrinsic jitter is generated by each component.

Figure 5:
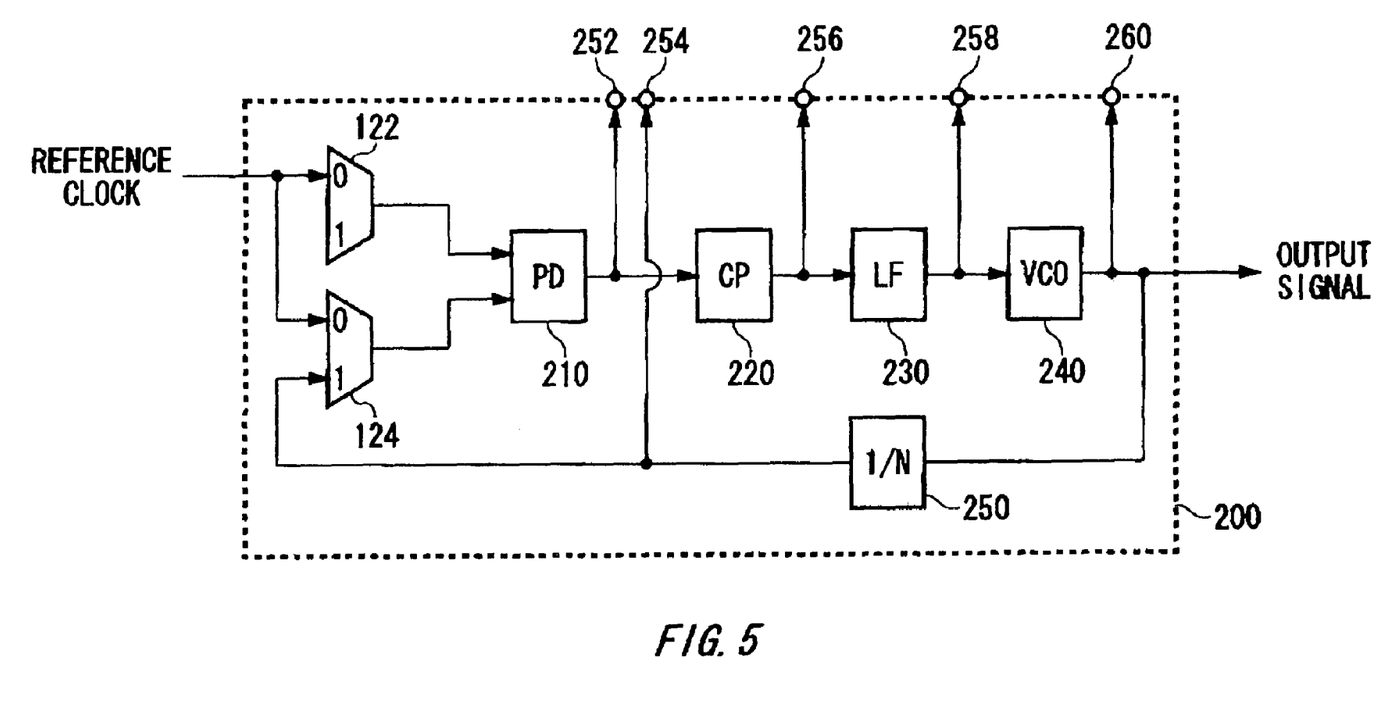
FIG. 5 shows a configuration of the PLL circuit 200 according to another embodiment of the present invention.

FIG. 5 shows a configuration of the PLL circuit 200 according to another embodiment of the present invention. In this example, the PLL circuit 200 further includes a multiplexer 122, a multiplexer 124 and a plurality of output terminals 252-260 in accordance with the configuration of the PLL circuit 200 explained in FIG. 1. Components in FIG. 5 bearing the same reference numerals as those in FIG. 1 will not be described because they have the same or similar functions as those in FIG. 1.

The output terminal 252 outputs a signal output from the phase detector 210 to an external measurement apparatus, and the output terminal 254 outputs a signal output from the frequency divider 250 to an external measurement apparatus, and the output terminal 256 outputs a signal output from the charge pump 220 to an external measurement apparatus, and the output terminal 258 outputs a signal output from the loop filter 230 to an external measurement apparatus, and the output terminal 260 outputs a signal output from the voltage controlled oscillator 240 to an external measurement apparatus. Moreover, the external measurement apparatus may supply a control signal by which the multiplexer 124 is controlled.

According to the configurations described above, the PLL circuit 200 which can easily measure the intrinsic jitter of each of the component can be provided.

Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

As is apparent from the above, according to the present invention, the intrinsic jitter of the circuit to be tested can be measured accurately. In addition, it can be measured accurately that which components generate intrinsic jitters and how much the intrinsic jitter is generated by each component.

What is claimed is:

1. A jitter measurement apparatus for measuring an intrinsic jitter of a circuit to be tested including a phase detector which outputs a signal according to a phase difference between a supplied first input signal and a supplied second input signal, comprising:

an input unit for supplying an identical signal to said phase detector as the first input signal and as the second input signal; and a jitter measurement unit for measuring the intrinsic jitter which is generated in an inside of the circuit to be tested by measuring a jitter of a signal which is generated in an inside of the circuit to be tested according to a signal output from said phase detector, wherein the intrinsic jitter is measured in a state of no jitter derived from the input signals being included in the output signal of the phase detector by supplying the identical signal as the first input signal and as the second input signals, wherein the circuit to be tested comprises a latter circuit which receives a signal output from said phase detector and outputs a signal based on a received signal, wherein said jitter measurement apparatus measures a jitter of a signal output from said latter circuit, and wherein said jitter measurement unit measures an intrinsic jitter of said latter circuit based on a difference between a jitter of a signal output from said phase detector and a jitter of a signal output from said latter circuit.

2. The jitter measurement apparatus in claim 1, wherein said jitter measurement unit measures the intrinsic jitter of said phase detector by measuring a jitter of a signal output from said phase detector.

3. The jitter measurement apparatus in claim 1, wherein said circuit to be tested corresponding to a phase locked loop circuit further comprises a latter circuit comprising:

a charge pump for outputting a signal according to a signal output from said phase detector;

a loop filter for outputting a signal according to a signal output from said charge pump;

a voltage controlled oscillator for outputting an oscillation signal according to a signal output from said loop filter; and a frequency divider for dividing the oscillation signal output from said voltage controlled oscillator and outputting a divided signal to said phase detector, and said jitter measurement unit measures at least one of the signal output from said charge pump, said loop filter, said voltage controlled oscillator and said frequency divider.

4. The jitter measurement apparatus in claim 3, wherein said input unit further comprises:

a signal selector which receives the second input signal and a signal output from said frequency divider, wherein said signal selector selects the second input signal and inputs the selected second input signal to said phase detector when measuring an intrinsic jitter of said circuit to be tested, and said signal selector selects a signal output from said frequency divider and inputs the selected signal outputted from said frequency divider to said phase detector when said circuit to be tested operates as a PLL circuit.

5. The jitter measurement apparatus in claim 4, wherein said input unit further comprises a dummy selector which receives the first input signal and inputs the received first input signal to said phase detector, said dummy selector having the same characteristic of said signal selector.

6. The jitter measurement apparatus in claim 1, wherein said input unit inputs signals, between which the phase difference is approximately zero and whose wave shapes are identical, to said phase detector as the first input signal and the second input signal.

7. The jitter measurement apparatus in claim 1, wherein said input unit inputs signals, between which the phase difference is not zero and whose wave shapes are identical, to said phase detector as the first input signal and the second input signal.

8. The jitter measurement apparatus in claim 1, wherein said input section inputs a clock signal, whose period is constant, to said phase detector as the first input signal and as the second input signal.

9. The jitter measurement apparatus in claim 1, wherein said input section inputs a data signal whose period is not constant, to said phase detector as the first input signal and as the second input signal.

10. The jitter measurement apparatus in claim 1, wherein
said input section changes a frequency of each of the first input signal and the second input signal sequentially and inputs the changed signals to said phase detector, and
said jitter measurement unit measures the intrinsic jitter of said circuit to be tested every time said input unit changes the frequency.

11. A phase locked loop circuit comprising an oscillation mode for inputting an oscillation signal synchronized with a reference clock that is supplied, and a measuring mode for measuring an intrinsic jitter which is generated in an inside of the phase locked loop circuit, comprising:
a voltage controlled oscillator for generating the oscillation signal having a frequency based on a control voltage;
a frequency divider for dividing the oscillation signal;
a phase detector for generating the control voltage based on a phase difference between the reference clock and a comparable signal that is supplied; and
a signal selector which receives the reference clock and a signal output from said frequency divider,
wherein said signal selector supplies the reference clock to said phase detector as the comparable signal when said phase locked loop circuit operates in the measurement mode, and said signal selector supplies a signal output from said frequency divider to said phase detector as the comparable signal when said phase locked loop circuit operates in the oscillation mode,
wherein the intrinsic jitter is measured in a state of no jitter derived from the input signals being included in the output signal of the phase detector by supplying the identical signal as the first input signal and as the second input signals, wherein the phase locked loop circuit comprises a latter circuit which receives a signal output from said phase detector and outputs a signal based on a received signal,
wherein a jitter of a signal output from said latter circuit is measured, and
wherein an intrinsic jitter of said latter circuit is measured based on a difference between a jitter of a signal output from said phase detector and a jitter of a signal output from said latter circuit.

12. The phase locked loop circuit in claim 11, further comprising an output terminal from which the control voltage of said phase detector is output to an external measurement apparatus.

13. A method for measuring an intrinsic jitter of a circuit to be tested comprising a phase detector which outputs a signal based on a phase difference between a supplied first input signal and a supplied second input signal, comprising steps of:
supplying an identical signal to said phase detector as the first input signal and as the second input signal; and
measuring the intrinsic jitter which is generated in an inside of the circuit to be tested by measuring a jitter of a signal which is generated in an inside of the circuit to be tested, according to an output signal output from said phase detector,
wherein the intrinsic jitter is measured in a state of no jitter derived from the input signals being included in the output signal of the phase detector by supplying the identical signal as the first input signal and as the second input signals,
wherein a jitter of a signal output from a latter circuit that receives a signal output from said phase detector and outputs a signal based on a received signal is measured,
wherein the circuit to be tested comprises the latter circuit, and
wherein an intrinsic jitter of said latter circuit is measured based on a difference between a jitter of a signal output from said phase detector and a jitter of a signal output from said latter circuit.

14. The jitter measurement apparatus in claim 1, wherein said circuit to be tested corresponding to a phase locked loop circuit further comprises a latter circuit comprising:
a charge pump for outputting a signal according to a signal output from said phase detector;
a loop filter for outputting a signal according to a signal output from said charge pump;
a voltage controlled oscillator for outputting an oscillation signal according to a signal output from said loop filter; and
a frequency divider for dividing the oscillation signal output from said voltage controlled oscillator and outputting a divided signal to said phase detector, and
said jitter measurement unit measures at least one of the signal output from said charge pump, said loop filter, said voltage controlled oscillator and said frequency divider.

15. The jitter measurement apparatus in claim 1, wherein said jitter measurement unit measures an intrinsic jitter of said latter circuit comparing the jitter of the signal output from said phase detector with the jitter of the signal output from said latter circuit.

* * * * *